United States Patent
Murdock

(10) Patent No.: US 11,791,251 B2
(45) Date of Patent: Oct. 17, 2023

(54) HIGH POWER LAMINATE RF PACKAGE

(71) Applicant: Qorvo US, Inc., Greensboro, NC (US)

(72) Inventor: Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/388,499

(22) Filed: Jul. 29, 2021

(65) Prior Publication Data

US 2023/0036197 A1    Feb. 2, 2023

(51) Int. Cl.
| | |
|---|---|
| H01L 23/34 | (2006.01) |
| H01L 23/498 | (2006.01) |
| H01L 25/16 | (2023.01) |
| H01L 23/057 | (2006.01) |
| H01L 23/00 | (2006.01) |
| H01L 23/047 | (2006.01) |
| H01L 23/373 | (2006.01) |

(52) U.S. Cl.
CPC .... H01L 23/49822 (2013.01); H01L 23/49811 (2013.01); H01L 23/49838 (2013.01); H01L 25/162 (2013.01); H01L 25/165 (2013.01); H01L 23/047 (2013.01); H01L 23/057 (2013.01); H01L 23/3735 (2013.01); H01L 24/48 (2013.01); H01L 24/73 (2013.01); H01L 2224/48155 (2013.01); H01L 2224/73265 (2013.01)

(58) Field of Classification Search
CPC .......................... H01L 23/49822; H01L 23/34; H01L 2924/14321
See application file for complete search history.

(56) References Cited

U.S. PATENT DOCUMENTS

| | | | |
|---|---|---|---|
| 5,736,783 | A | 4/1998 | Wein et al. |
| 5,773,879 | A | 6/1998 | Fusayasu et al. |
| 6,511,866 | B1 | 1/2003 | Bregante et al. |
| 10,015,882 | B1 | 7/2018 | Murdock et al. |
| 2002/0096767 | A1 | 7/2002 | Cote et al. |
| 2015/0103491 | A1 | 4/2015 | Ma |
| 2019/0051615 | A1* | 2/2019 | Nair et al. ......... H01L 21/4857 |

OTHER PUBLICATIONS

Final Office Action for U.S. Appl. No. 14/589,464, mailed Mar. 9, 2017, 12 pages.
Final Office Action for U.S. Appl. No. 14/589,464, mailed Oct. 23, 2017, 14 pages.
Non-Final Office Action for U.S. Appl. No. 14/589,464, mailed Jul. 6, 2017, 16 pages.
Non-Final Office Action for U.S. Appl. No. 14/589,464, mailed Nov. 18, 2016, 16 pages.
Notice of Allowance for U.S. Appl. No. 14/589,464, mailed Mar. 9, 2018, 10 pages.

* cited by examiner

*Primary Examiner* — Michele Fan
(74) *Attorney, Agent, or Firm* — Withrow & Terranova, P.L.L.C.

(57) ABSTRACT

The present disclosure relates to a package capable of handling high radio frequency (RF) power, which includes a carrier, a ring structure attached to a top surface of the carrier, an RF die attached to the top surface of the carrier within an opening of the ring structure and electrically connected to the ring structure, a heat spreader attached to a top surface of the ring structure, and an output signal lead configured to send out RF output signals generated by the RF die. Herein, the heat spreader covers a portion of the top surface of the ring structure at an output side of the package, and the output signal lead is attached to a top surface of the heat spreader. As such, the RF output signals are capable of being transmitted from the RF die to the output signal lead through the ring structure and the heat spreader.

16 Claims, 4 Drawing Sheets

HIGH POWER LAMINATE RF PACKAGE

FIELD OF THE DISCLOSURE

The present disclosure relates to a radio frequency (RF) package, more particularly to a laminate RF package capable of handling high RF power.

BACKGROUND

Often, semiconductor electronic components (e.g., semiconductor radio frequency (RF) dies, active components, and/or passive components) may be housed in a package, which may be composed of one or more of metal, plastic, glass, and/or ceramic. The package may protect the semiconductor electronic components against potentially damaging contact, and may prevent corrosion or other damage, for example, from moisture and/or dust.

In addition, with developed semiconductor fabrication technology, high speed and high performance transistors may be more densely integrated on semiconductor RF dies. Consequently, the RF power needed and the amount of heat generated by the semiconductor RF dies will increase significantly. If the package used for housing the semiconductor RF dies has high RF loss and/or poor thermal conductivity, trace heating may cause package failure.

Accordingly, it is therefore an object of the present disclosure to provide an RF package structure, which is capable of protecting one or more semiconductor RF dies from an external environment and capable of handling high RF power. In addition, there is also a need to manufacture the RF package in a cost effective and customizable manner.

SUMMARY

The present disclosure relates to a laminate radio frequency (RF) package, which is capable of handling high RF power. The disclosed laminate RF package includes a carrier with a top surface, a ring structure, an RF die, a heat spreader, and one or more output-side leads. Both the ring structure and the RF die are attached to the top surface of the carrier. The RF die resides within an opening of the ring structure and is electrically connected to the ring structure. The heat spreader is attached to a top surface of the ring structure. The one or more output-side leads, which include an output signal lead, are configured to send out RF output signals generated by the RF die. Herein, the one or more output-side leads are located at an output side of the package, on which the package will provide the RF output signals to external circuitry. The heat spreader covers a portion of the top surface of the ring structure at the output side of the package, and the output signal lead is attached to a top surface of the heat spreader. As such, the RF output signals are capable of being transmitted from the RF die to the output signal lead through the ring structure and the heat spreader.

In one embodiment of the laminate RF package, the one or more output-side leads further include at least one of a direct-current (DC) lead configured to receive a DC power source and a ground lead configured to be connected to ground.

In one embodiment of the laminate RF package, each of the one or more output-side leads is attached to the top surface of the heat spreader. Herein, the ring structure includes a number of connecting traces at the top surface of the ring structure. The heat spreader includes a number of spreader traces at the top surface of the heat spreader, and a number of spreader vias extending vertically through the heat spreader. Each of the one or more output-side leads is attached to a corresponding spreader trace, and each spreader via electrically connects one of the spreader traces to a corresponding connecting trace.

In one embodiment of the laminate RF package, except the output signal lead, each of the one or more output-side leads does not reside over the heat spreader and is attached to the top surface of the ring structure. Herein, the ring structure includes a number of connecting traces at the top surface of the ring structure. The heat spreader includes a spreader trace at the top surface of the heat spreader, and a spreader via extending vertically through the heat spreader. The output signal lead is attached to the spreader trace, and each of the one or more output-side leads, except the output signal lead, is attached to a corresponding connecting trace at the top surface of the ring structure. The spreader via electrically connects the spreader trace to a corresponding connecting trace for the output signal lead.

In one embodiment of the laminate RF package, the ring structure further includes a number of structure vias on the output-side of the package. The structure vias extend vertically through the ring structure for heat conducting between the carrier and the heat spreader.

In one embodiment of the laminate RF package, the ring structure is a laminate, and the heat spreader is formed of ceramic.

In one embodiment of the laminate RF package, the ring structure is a printed circuit board, and the heat spreader is formed of aluminum oxide, aluminum nitride, or diamond.

According to one embodiment, the laminate RF package further includes one or more electronic components, which are attached to at least one of the top surface of the carrier and within the opening of the ring structure, the top surface of the ring structure, and the top surface of the heat spreader.

According to one embodiment, the laminate RF package further has one or more input-side leads including an input signal lead configured to receive RF input signals. The one or more input-side leads is located at an input side of the package, on which the package will receive the RF input signals for the RF die.

In one embodiment of the laminate RF package, each of the one or more input-side leads is attached to the top surface of the ring structure. The RF input signals are capable of being transmitted from the input signal lead to the RF die through the ring structure.

According to one embodiment, the laminate RF package further includes an extra heat spreader attached to the top surface of the ring structure. Herein, the extra heat spreader covers a portion of the top surface of the ring structure at the input side of the package. Each of the one or more input-side leads is attached to a top surface of the extra heat spreader. The RF input signals are capable of being transmitted from the input signal lead to the RF die through the extra heat spreader and the ring structure.

In one embodiment of the laminate RF package, the ring structure includes a number of connecting traces at the top surface of the ring structure. The heat spreader includes a number of spreader traces at the top surface of the heat spreader, and a number of spreader vias extending vertically through the heat spreader. The extra heat spreader includes a number of extra spreader traces at the top surface of the extra heat spreader, and a number of extra spreader vias extending vertically through the extra heat spreader. Herein, each of the one or more output-side leads is attached to a corresponding spreader trace, and each spreader via electrically connects one of the spreader traces to a corresponding connecting trace. Each of the one or more input-side leads is attached to a corresponding extra spreader trace, and each of the extra spreader vias electrically connects one of the extra spreader traces to a corresponding connecting trace.

In one embodiment of the laminate RF package, the ring structure includes a number of structure vias on both the input-side and output-side of the package. The structure vias extend vertically through the ring structure for heat conducting between the carrier and the heat spreader, and between the carrier and the extra heat spreader.

In one embodiment of the laminate RF package, the one or more input-side leads further include at least one of a DC lead configured to receive a DC power source and a ground lead configured to be connected to ground.

In one embodiment of the laminate RF package, the heat spreader has a ring configuration and is vertically aligned with the ring structure. Herein, the heat spreader covers portions on both the input side and the output side of the package. Each of the one or more input-side leads is attached to the top surface of the heat spreader, such that the RF input signals are capable of being transmitted from the input signal lead to the RF die through the heat spreader and the ring structure. Each of the one or more output-side leads is attached to the top surface of the heat spreader. Additionally, the ring structure includes a number of connecting traces at the top surface of the ring structure. The heat spreader includes a number of spreader traces at the top surface of the heat spreader, and a number of spreader vias extending vertically through the heat spreader. Each of the one or more output-side leads and the one or more input-side leads is attached to a corresponding spreader trace. Each spreader via electrically connects one of the spreader traces to a corresponding connecting trace.

According to one embodiment, the laminate RF package further includes a lid attached to exposed portions of the top surface of the ring structure, exposed portions of the top surface of the heat spreader, the one or more input-side leads, and the one or more output-side leads so as to seal the RF die.

In one embodiment of the laminate RF package, the carrier is formed of a metal, a metal alloy, ceramic, diamond, or metal diamond composites, and the lid is formed of plastic or ceramic.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
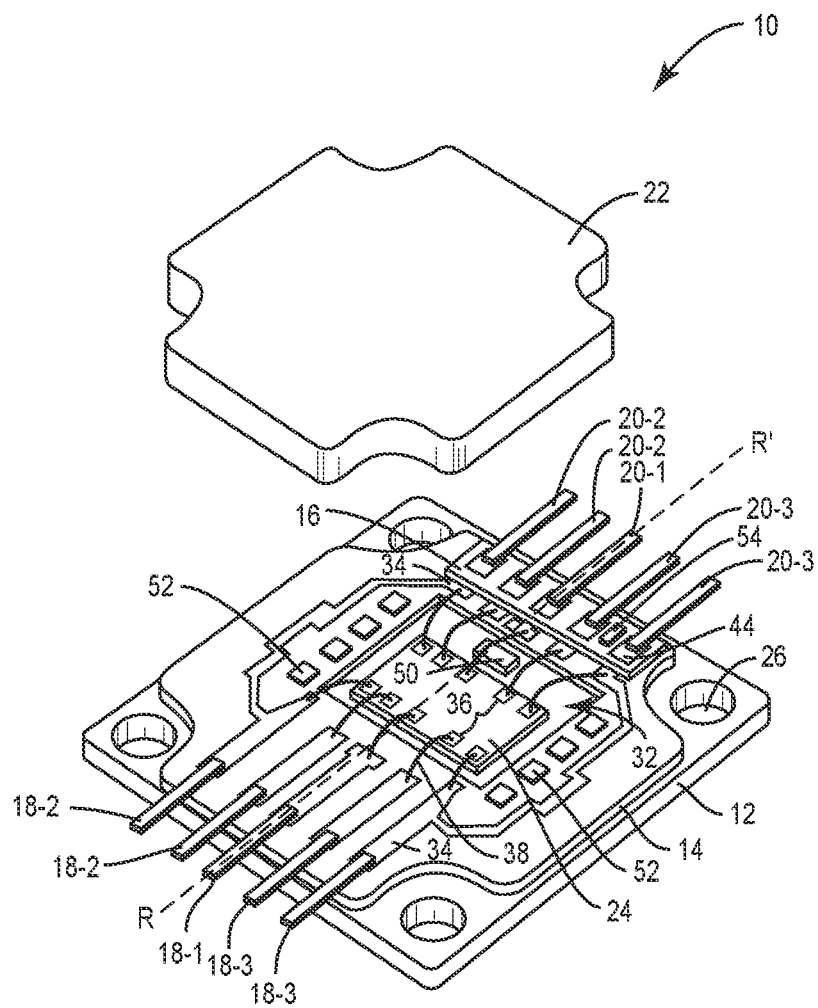
FIGS. 1A and 1B illustrate an exemplary laminate radio frequency (RF) package according to one embodiment of the present disclosure.

It will be understood that for clear illustrations, FIGS. 1A-4B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1B:
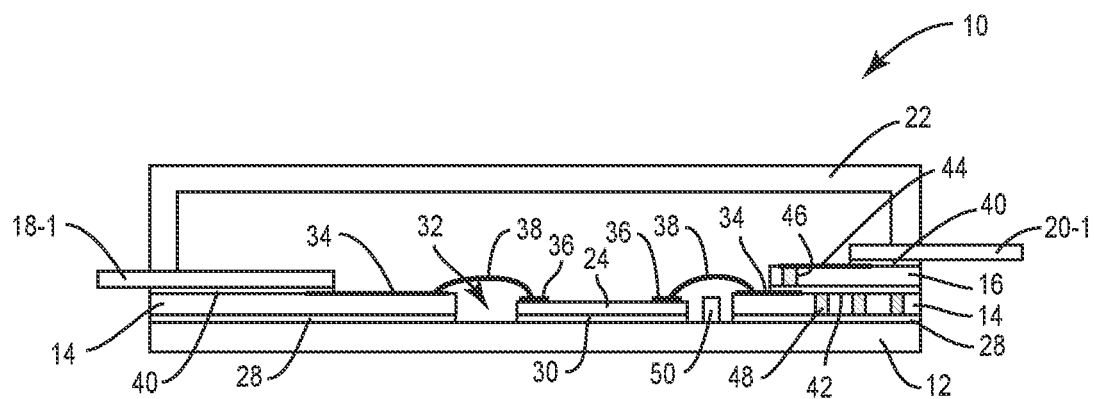

The present disclosure relates to a laminate radio frequency (RF) package capable of handling high RF power. FIGS. 1A and 1B illustrate an exemplary laminate RF package 10 according to one embodiment of the present disclosure. FIG. 1A shows a three-dimensional (3D) view of the laminate RF package 10, and FIG. 1B shows a cross-sectional view of the laminate RF package 10 along the dashed line R-R' in FIG. 1A. The laminate RF package 10 includes a carrier 12, a ring structure 14, a heat spreader 16, input-side leads 18, output-side leads 20, a lid 22, and an RF die 24.

In detail, the carrier 12 may be sufficiently rigid so as to prevent undesired flexing of any components coupled thereto (e.g., the ring structure 14 and the RF die 24, etc.). The carrier 12 may be formed of any suitable material, such as a metal (e.g., copper, tungsten), metal alloy (e.g., tungsten-copper, or copper-molybdenum-copper), ceramic, diamond, or metal diamond composites. Examples of suitable materials include an electrically or thermally conductive or non-conductive material, depending upon different applications. In another embodiment, the base carrier 12 may be further plated, such as with a conductive material (e.g., gold).

Additionally, the carrier 12 may include a number of holes 26 (only one hole is labeled with a reference number for clarity) suitable for receiving a fastening means, such as screws or pins. The holes 26 may allow the laminate RF package 10 to be affixed to a host device or system, such as an RF system.

Both the ring structure 14 and the RF die 24 reside over a top surface of the carrier 12. The ring structure 14 may be a laminate (e.g., a printed circuit board) with connecting traces 34 buried internally (not shown) or on external surfaces (e.g., a top surface of the ring structure 14). The ring structure 14 may be attached to the top surface of the carrier 12 using an adhesive material 28 (e.g., epoxy), soldering, pressure bonding, and/or temperature bonding.

The RF die 24 may be formed of any suitable semiconducting material, such as gallium Arsenide, gallium nitride, or another suitable semiconductor. The RF die 24 may be connected to the top surface of the carrier 12 via a die attach 30 (e.g., gold-tin or other alloys). The RF die 24 is located within an opening 32 of the ring structure 14, such that the ring structure 14 surrounds the RF die 24. The RF die 24 includes die pads 36 on a top surface of the RF die 24, each of which is connected to a corresponding connecting trace 34 via an interconnect 38, such as a wire or a ribbon bond (only some connecting traces, some die pads, and some interconnects are labeled with reference numbers for clarity). The connecting traces 34 and the die pads 36 may be formed of any suitably conductive material, such as copper.

The input-side leads 18 are leads located at a first (input) side of the laminate RF package 10, on which the laminate RF package 10 will receive RF input signals. The input-side leads 18 at least include one input signal lead 18-1 configured to receive RF input signals for the RF die 24. For the purpose of this illustration, the input-side leads 18 also include two direct current (DC) leads 18-2 and two ground leads 18-3. The DC leads 18-2 are configured to receive a DC power source and the ground leads 18-3 are configured to be connected to ground. In different applications, there might be more input signal leads 18-1, more or fewer or no DC leads 18-2, and more or fewer or no ground leads 18-3. Each of the input-side leads 18 might be formed of a metal or metal alloy, such as copper.

In one embodiment, each input-side lead 18 may reside over the ring structure 14 and may be electrically connected to a corresponding connecting trace 34 via a lead attach 40. As such, an RF input signal received on the input signal lead 18-1 can be transmitted to the RF die 24 through a corresponding connecting trace 34, a corresponding interconnect 38, and a corresponding die pad 36. The lead attach 40 might be a conductive solder or braze. In another embodiment, the input-side leads 18 may traverse (horizontally) through the ring structure 14 (not shown).

The output-side leads 20 are leads located at a second (output) side of the laminate RF package 10, on which the laminate RF package 10 will provide RF output signals to an external circuitry/system. The output-side leads 20 at least include one output signal lead 20-1, which is configured to transmit the RF output signals generated by the RF die 24. For the purpose of this illustration, the output-side leads 20 also include two DC leads 20-2, and two ground leads 20-3. The DC leads 20-2 are configured to receive a DC power source and the ground leads 20-3 are configured to be connected to ground. Each of the output-side leads 20 might be formed of a metal or metal alloy, such as copper. The first (input) side of the laminate RF package 10 is opposite to the second (output) side of the laminate RF package 10. In different applications, there might be more output signal leads 20-1, more or fewer or no DC leads 20-2, and more or fewer or no ground leads 20-3. In different applications, the first (input) side of the laminate RF package 10 and the second (output) side of the laminate RF package 10 may be orthogonal sides of each other.

Unlike the input-side leads 18 directly connected to the ring structure 14 via the lead attach 40, there is the heat spreader 16 located between the output-side leads 20 and the ring structure 14. The heat spreader 16 resides over the top surface of the ring structure 14, and each output-side lead 20 resides over a top surface of the heat spreader 16.

The heat spreader 16 is coupled to the top surface of the ring structure 14 via a spreader attach 42, such as a conductive solder or epoxy. In one embodiment, the heat spreader 16 covers a portion of the ring structure 14 on the second (output) side of the laminate RF package 10, so as to cover a portion of each connecting trace 34 that corresponds to the output-side leads 20.

The heat spreader 16 includes spreader traces 44 on the top surface of the heat spreader 16, and each output-side lead 20 is coupled to a corresponding spreader trace 44 via the lead attach 40 (only one spreader trace is labeled with a reference number for clarity). In addition, the heat spreader 16 includes one or more spreader vias 46 to connect each spreader trace 44 to a corresponding connecting trace 34 on the top surface of the ring structure 14, respectively (only one spreader via is labeled with a reference number for clarity). Accordingly, an RF output signal generated from the RF die 24 can be transmitted to the output signal lead 20-1 through a corresponding die pad 36, a corresponding interconnect 38, a corresponding connecting trace 34, a corresponding spreader via 46, and a corresponding spreader trace 44. In some applications, the ring structure 14 may also include some structure vias 48 on the output-side of the laminate RF package 10, which extends vertically through the ring structure 14 for heat conducting between the carrier 12 and the heat spreader 16 (only one structure via is labeled with a reference number for clarity). The structure vias 48 might be separate from any connecting trace 34, and will not transmit any electrical signal (e.g., RF, DC, etc.).

The heat spreader 16 may be a ceramic tab (e.g., aluminum oxide, aluminum nitride, or diamond), which creates a low RF loss and high thermal conductivity area for trace heating to occur. When compared to a conventional laminate, the aluminum oxide tab may only create 10% of the RF loss. This large reduction in RF loss directly translates to less heat generation and significantly cooler operating temperatures. In addition, the aluminum oxide tab may contribute 10 times the thermal conductivity when compared to a laminate. Although the laminate RF package 10 gains from this thermal conductivity increase will be somewhat subdued by the reduced heat load and increased heat source to heat sink distance, the spreading capability of the heat spreader 16 will further benefit the system by reducing heat flux within the ring structure 14.

Assuming fixed RF output power, the addition of the heat spreader 16 may significantly reduce heating in the ring structure 14. For instance, when the heat spreader 16 is the aluminum oxide tab, the heating in the laminate ring structure may be reduced by approximately 65% when compared to the legacy configuration without the heat spreader 16.

In some applications, the laminate RF package 10 may further include one or more electronic components. For the purpose of this illustration, the laminate RF package 10 includes one first electronic component 50 coupled to the top surface of the carrier 12 and within the opening 32 of the ring structure 14, eight second electronic components 52 coupled to the top surface of the ring structure 14 (e.g., not on the first/input side or second/output side of the laminate RF package 10), and one third electronic component 54 coupled to the top surface of the heat spreader 16. Each of the first, second, and third electronic components 50, 52, and 54 may be an active component (e.g., transistor, diode, and the like) or a passive component (e.g., resistor, capacitor, inductor, transformer, and the like).

The lid 22 may have a top surface supported by a number of walls, and the walls may be attached, using any suitable adhesive material (e.g., epoxy, resin, acrylic, and/or silicone, not shown), to exposed portions of the top surface of the ring structure 14, exposed portions of the top surface of the heat spreader 16, the input-side leads 18, and the output-side leads 20. Accordingly, the lid 22 may provide space above the ring structure 14 and the heat spreader 16 so as to accommodate the RF die 24 within the opening 32 even if the RF die 24 has a height greater than the ring structure 14. A combination of the carrier 12, the ring structure 14, the heat spreader 16, the input-side leads 18, the output-side leads 20, and the lid 22 may enclose the RF die 24 and the electronic components 50, 52, and 54. This enclosure may seal the RF die 24 and the electronic components 50, 52, and 54 therein.

Figure 2A:
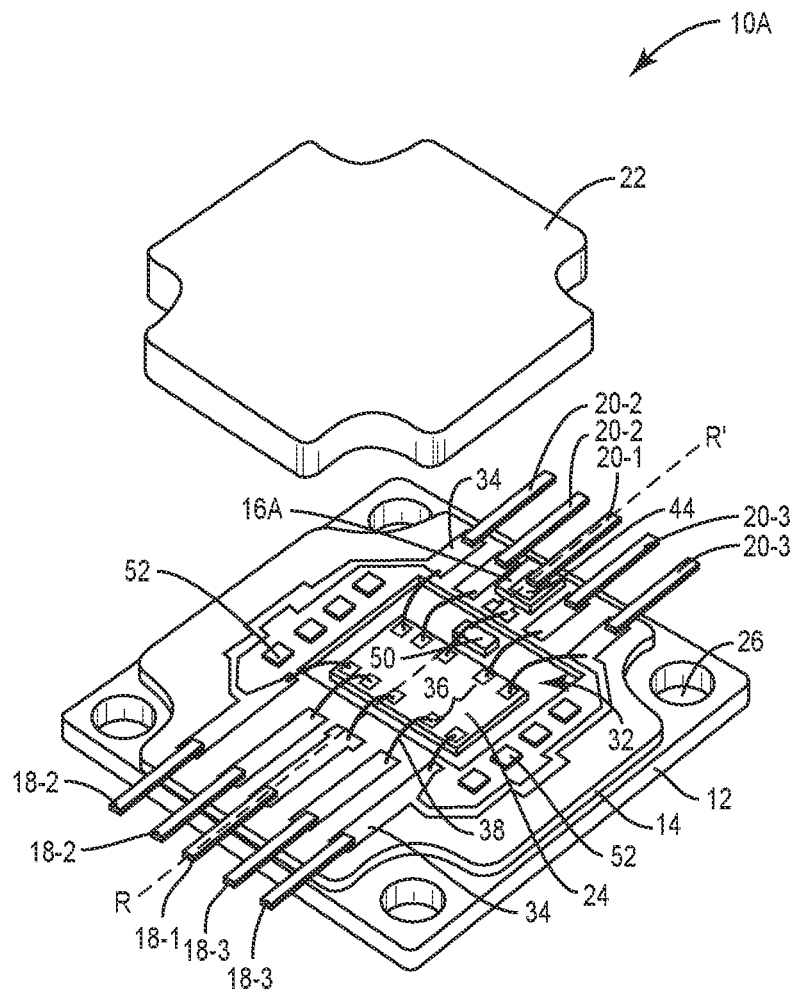
FIGS. 2A and 2B illustrate a first alternative laminate RF package according to one embodiment of the present disclosure.
Figure 2B:
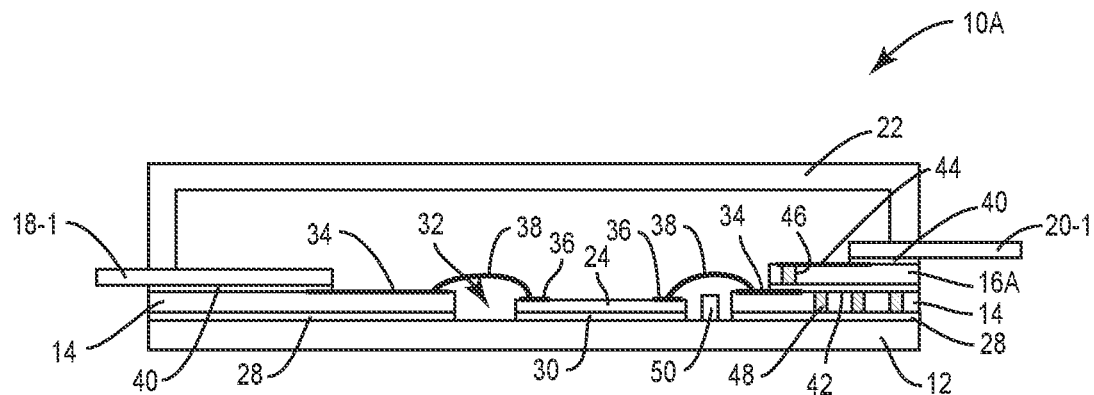

FIGS. 2A and 2B illustrate a first alternative laminate RF package 10A according to another embodiment of the present disclosure. In the laminate RF package 10, each output-side lead 20 resides over the heat spreader 16 and the heat spreader 16 covers portions of some connecting traces 34 (on the top surface of the ring structure 14 and on the output-side of the laminate RF package 10), each of which is corresponding to one spreader trace 44/one output-side lead 20 on the top surface of the heat spreader 16. However, the first alternative laminate RF package 10A includes a first alternative heat spreader 16A, which only covers a portion of one connecting trace 34 corresponding to the input signal lead 18-1. Herein, only the input signal lead 18-1 resides over the first alternative heat spreader 16A, while the DC leads 18-2 and the ground leads 18-3 are directly coupled to corresponding connecting traces 34 (on the top surface of the ring structure 14 and on the output-side of the laminate RF package 10) via the lead attach 40. Herein, if the alternative heat spreader 16A is not large enough, there may be no third component 54 coupled to a top surface of the alternative heat spreader 16A.

Figure 3A:
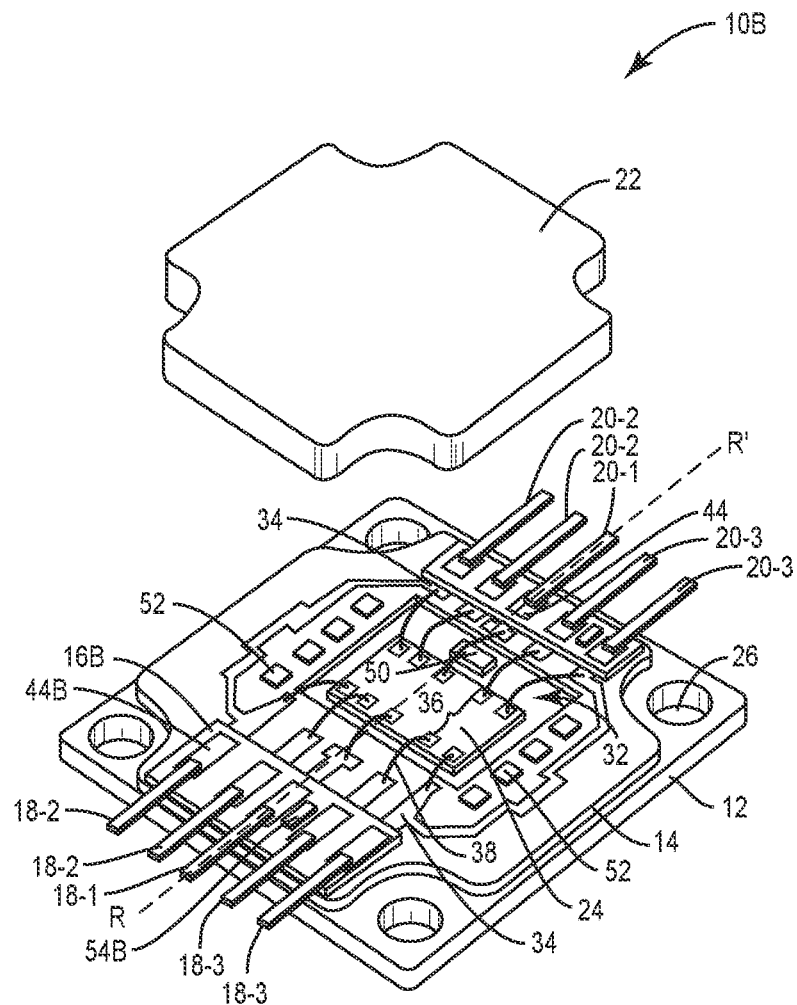
FIGS. 3A and 3B illustrate a second alternative laminate RF package according to one embodiment of the present disclosure.
Figure 3B:
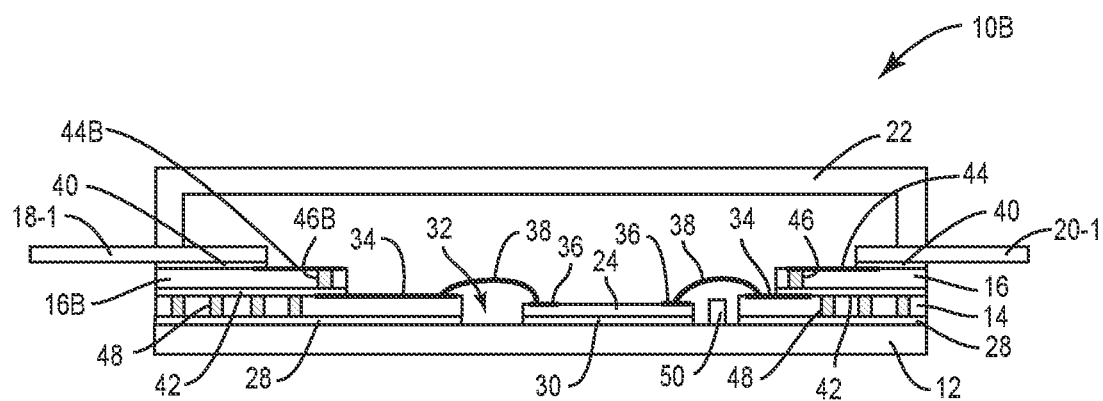

FIGS. 3A and 3B illustrate a second alternative laminate RF package 10B according to one embodiment of the present disclosure. In the laminate RF package 10, there is only one heat spreader 16 that covers a portion of the top surface of the ring structure 14 on the output-side of the laminate RF package 10. However, the second alternative laminate RF package 10B further includes, in addition to the heat spreader 16, an extra heat spreader 16B, which is located between the input-side leads 18 and the ring structure 14. The extra heat spreader 16B resides over the top surface of the ring structure 14 on the input-side of the laminate RF package 10, and each input-side lead 18 resides over a top surface of the extra heat spreader 16B.

The extra heat spreader 16B is coupled to the top surface of the ring structure 14 via the spreader attach 42. In one embodiment, the extra heat spreader 16B covers a portion of the ring structure 14 on the first (input) side of the laminate RF package 10, so as to cover a portion of each connecting trace 34 that corresponds to the input-side leads 18.

The extra heat spreader 16B includes extra spreader traces 44B on the top surface of the extra heat spreader 16B, and each input-side lead 18 is coupled to a corresponding extra spreader trace 44B via the lead attach 40 (only one extra spreader trace is labeled with a reference number for clarity). In addition, the extra heat spreader 16B includes one or more extra spreader vias 46B to connect each extra spreader trace 44B to a corresponding connecting trace 34 on the top surface of the ring structure 14, respectively (only one extra spreader via is labeled with a reference number for clarity). Accordingly, an RF input signal received on the input signal lead 18-1 can be transmitted to the RF die 24 through a corresponding extra spreader trace 44B, a corresponding extra spreader via 46B, a corresponding connecting trace 34, a corresponding interconnect 38, and a corresponding die pad 36. In some applications, the ring structure 14 may also include some structure vias 48 on the input-side of the laminate RF package 10, which extends vertically through the ring structure 14 for heat conducting between the carrier 12 and the extra heat spreader 16B (only one extra structure via is labeled with a reference number for clarity).

Similar to the heat spreader 16, the extra heat spreader 16B may be a ceramic tab (e.g., aluminum oxide, aluminum nitride, or diamond), which creates a low RF loss and high thermal conductivity area for trace heating to occur. Herein, the extra heat spreader 16B may accommodate an extra electronic component 54B, which is coupled to the top surface of the extra heat spreader 16B via an adhesive material (the adhesive material not shown).

Figure 4A:
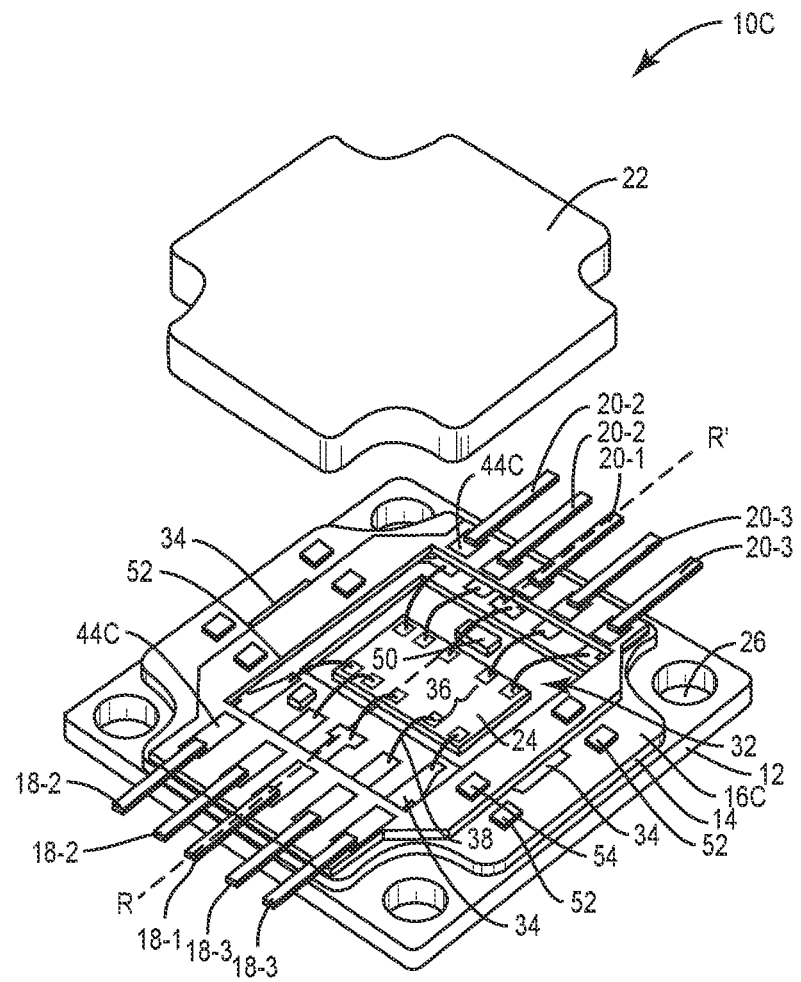
FIGS. 4A and 4B illustrate a third alternative laminate RF package according to one embodiment of the present disclosure.
Figure 4B:
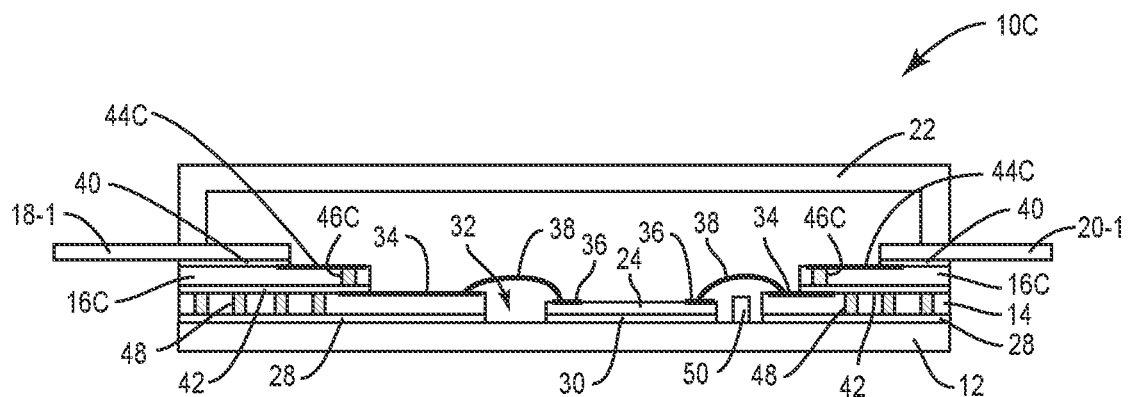

FIGS. 4A and 4B illustrate a third alternative laminate RF package 10C according to one embodiment of the present disclosure. In the laminate RF package 10, the heat spreader 16 is a tab shape and only covers a portion of the ring structure 14 on the output-side of the laminate RF package 10. However, the third alternative laminate RF package 10C includes a ring heat spreader 16C, which has a ring configuration, covers portions at both the first (input) side and the second (output) side of the laminate RF package 10, and is vertically aligned with the laminate ring structure 14. Herein, both the input-side leads 18 and the output-side leads 20 reside over the ring heat spreader 16C.

The ring heat spreader 16C is coupled to the top surface of the ring structure 14 via the spreader attach 42. The ring heat spreader 16C includes ring spreader traces 44C on a top surface of the ring heat spreader 16C, and each lead 18/20 is coupled to a corresponding ring spreader trace 44C via the lead attach 40 (only some ring spreader traces are labeled with a reference number for clarity). In addition, the ring heat spreader 16C includes multiple ring spreader vias 46C at both the first (input) side and the second (output) side of the laminate RF package 10 to connect each ring spreader trace 44C to a corresponding connecting trace 34 on the top surface of the ring structure 14, respectively (only some ring spreader vias are labeled with a reference number for clarity). Accordingly, an RF input signal received on the input signal lead 18-1 can be transmitted to the RF die 24, and an RF output signal generated by the RF die 24 can be transmitted to the output signal lead 20-1. In some applications, the ring structure 14 may include structure vias 48 at both the first (input) side and the second (output) side of the laminate RF package 10. Each structure via 48 extends vertically through the ring structure 14 for heat conducting between the carrier 12 and the ring heat spreader 16C.

Similar to the heat spreader 16, the ring heat spreader 16C may be formed of a ceramic material (e.g., aluminum oxide, aluminum nitride, or diamond), which creates a low RF loss and a high thermal conductivity area for trace heating to occur. Herein, the ring heat spreader 16C may accommodate one or more electronic components, which are coupled to the top surface of the ring heat spreader 16C via adhesive material (the adhesive material not shown). For the purpose of this illustration, the ring heat spreader 16C accommodates four third electronic components 54 (e.g., not at the first/input side or second/output side of the laminate RF package 10), and the laminate ring structure 14 accommodates four second electronic components 52. Notice that the portions of the ring structure 14, which are covered by the ring heat spreader 16, will not accommodate any electronic component.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A package comprising:
    a carrier having a top surface;
    a ring structure attached to the top surface of the carrier;
    a radio frequency (RF) die attached to the top surface of the carrier and residing within an opening of the ring structure, wherein the ring structure is electrically connected to the RF die;
    a heat spreader attached to a top surface of the ring structure; and
    one or more output-side leads including an output signal lead configured to send out RF output signals generated by the RF die, wherein:
        the one or more output-side leads are located at an output side of the package, on which the package will provide the RF output signals to external circuitry; and
        the heat spreader covers a portion of the top surface of the ring structure at the output side of the package, and the output signal lead is attached to a top surface of the heat spreader, wherein the RF output signals are capable of being transmitted from the RF die to the output signal lead through the ring structure and the heat spreader.

2. The package of claim 1 wherein the one or more output-side leads further comprise at least one of a direct-current (DC) lead configured to receive a DC power source and a ground lead configured to be connected to ground.

3. The package of claim 2 wherein each of the one or more output-side leads is attached to the top surface of the heat spreader.

4. The package of claim 3 wherein:
    the ring structure comprises a plurality of connecting traces at the top surface of the ring structure;
    the heat spreader comprises a plurality of spreader traces at the top surface of the heat spreader, and a plurality of spreader vias extending vertically through the heat spreader; and
    each of the one or more output-side leads is attached to a corresponding one of the plurality of spreader traces, and each of the plurality of spreader vias electrically connects one of the plurality of spreader traces to a corresponding one of the plurality of connecting traces.

5. The package of claim 1 wherein the ring structure comprises a plurality of structure vias on the output-side of the package, wherein the plurality of structure vias extends vertically through the ring structure for heat conducting between the carrier and the heat spreader.

6. The package of claim 1 wherein:
    the ring structure is a laminate; and
    the heat spreader is formed of ceramic.

7. The package of claim 6 wherein:
    the ring structure is a printed circuit board; and the heat spreader is formed of aluminum oxide, aluminum nitride, or diamond.

8. The package of claim 1 further comprising one or more electronic components, which are attached to at least one of the top surface of the carrier and within the opening of the ring structure, the top surface of the ring structure, and the top surface of the heat spreader.

9. The package of claim 1 further comprising one or more input-side leads including an input signal lead configured to receive RF input signals, wherein the one or more input-side leads is located at an input side of the package, on which the package will receive the RF input signals for the RF die.

10. The package of claim 8 wherein each of the one or more input-side leads is attached to the top surface of the ring structure, wherein the RF input signals are capable of being transmitted from the input signal lead to the RF die through the ring structure.

11. The package of claim 8 further comprising an extra heat spreader attached to the top surface of the ring structure, wherein:
the extra heat spreader covers a portion of the top surface of the ring structure at the input side of the package; and
each of the one or more input-side leads is attached to a top surface of the extra heat spreader, wherein the RF input signals are capable of being transmitted from the input signal lead to the RF die through the extra heat spreader and the ring structure.

12. The package of claim 10 wherein:
the ring structure comprises a plurality of connecting traces at the top surface of the ring structure;
the heat spreader comprises a plurality of spreader traces at the top surface of the heat spreader, and a plurality of spreader vias extending vertically through the heat spreader;
the extra heat spreader comprises a plurality of extra spreader traces at the top surface of the extra heat spreader, and a plurality of extra spreader vias extending vertically through the extra heat spreader;
each of the one or more output-side leads is attached to a corresponding one of the plurality of spreader traces, and each of the plurality of spreader vias electrically connects one of the plurality of spreader traces to a corresponding one of the plurality of connecting traces; and
each of the one or more input-side leads is attached to a corresponding one of the plurality of extra spreader traces, and each of the plurality of extra spreader vias electrically connects one of the plurality of extra spreader traces to a corresponding one of the plurality of connecting traces.

13. The package of claim 10 wherein the ring structure comprises a plurality of structure vias on both the input-side and output-side of the package, wherein the plurality of structure vias extends vertically through the ring structure for heat conducting between the carrier and the heat spreader, and between the carrier and the extra heat spreader.

14. The package of claim 8 wherein the one or more input-side leads further comprises at least one of a DC lead configured to receive a DC power source and a ground lead configured to be connected to ground.

15. The package of claim 8 further comprising a lid attached to exposed portions of the top surface of the ring structure, exposed portions of the top surface of the heat spreader, the one or more input-side leads, and the one or more output-side leads so as to seal the RF die.

16. The package of claim 14 wherein:
the carrier is formed of a metal, a metal alloy, ceramic, diamond, or metal diamond composites; and
the lid is formed of plastic or ceramic.

* * * * *

UNITED STATES PATENT AND TRADEMARK OFFICE
CERTIFICATE OF CORRECTION

PATENT NO. : 11,791,251 B2
APPLICATION NO. : 17/388499
DATED : October 17, 2023
INVENTOR(S) : Dylan Murdock It is certified that error appears in the above-identified patent and that said Letters Patent is hereby corrected as shown below:

In the Claims

Replace the claim set, with the following claim set:

1. A package comprising: a carrier having a top surface; a ring structure attached to the top surface of the carrier; a radio frequency (RF) die attached to the top surface of the carrier and residing within an opening of the ring structure, wherein the ring structure is electrically connected to the RF die; a heat spreader attached to a top surface of the ring structure; and one or more output-side leads including an output signal lead configured to send out RF output signals generated by the RF die, wherein: the one or more output-side leads are located at an output side of the package, on which the package will provide the RF output signals to external circuitry; and the heat spreader covers a portion of the top surface of the ring structure at the output side of the package, and the output signal lead is attached to a top surface of the heat spreader, wherein the RF output signals are capable of being transmitted from the RF die to the output signal lead through the ring structure and the heat spreader.

2. The package of claim 1 wherein the one or more output-side leads further comprise at least one of a direct-current (DC) lead configured to receive a DC power source and a ground lead configured to be connected to ground.

3. The package of claim 2 wherein each of the one or more output-side leads is attached to the top surface of the heat spreader.

4. The package of claim 3 wherein: the ring structure comprises a plurality of connecting traces at the top surface of the ring structure; the heat spreader comprises a plurality of spreader traces at the top surface of the heat spreader, and a plurality of spreader vias extending vertically through the heat spreader, and each of the one or more output-side leads is attached to a corresponding one of the plurality of spreader traces, and each of the plurality of spreader vias electrically connects one of the plurality of spreader traces to a corresponding one of the plurality of connecting traces.

5. The package of claim 2 wherein, except the output signal lead, each of the one or more output-side Signed and Sealed this
Eighteenth Day of June, 2024

Katherine Kelly Vidal
*Director of the United States Patent and Trademark Office* leads does not reside over the heat spreader and is attached to the top surface of the ring structure.

6. The package of claim 5 wherein: the ring structure comprises a plurality of connecting traces at the top surface of the ring structure; the heat spreader comprises a spreader trace at the top surface of the heat spreader, and a spreader via extending vertically through the heat spreader, the output signal lead is attached to the spreader trace, and each of the one or more output-side leads, except the output signal lead, is attached to a corresponding connecting trace at the top surface of the ring structure; and the spreader via electrically connects the spreader trace to a corresponding connecting trace for the output signal lead.

7. The package of claim 1 wherein the ring structure comprises a plurality of structure vias on the output-side of the package, wherein the plurality of structure vias extends vertically through the ring structure for heat conducting between the carrier and the heat spreader.

8. The package of claim 1 wherein: the ring structure is a laminate; and the heat spreader is formed of ceramic.

9. The package of claim 8 wherein: the ring structure is a printed circuit board; and the heat spreader is formed of aluminum oxide, aluminum nitride, or diamond.

10. The package of claim 1 further comprising one or more electronic components, which are attached to at least one of the top surface of the carrier and within the opening of the ring structure, the top surface of the ring structure, and the top surface of the heat spreader.

11. The package of claim 1 further comprising one or more input-side leads including an input signal lead configured to receive RF input signals, wherein the one or more input-side leads is located at an input side of the package, on which the package will receive the RF input signals for the RF die.

12. The package of claim 11 wherein each of the one or more input-side leads is attached to the top surface of the ring structure, wherein the RF input signals are capable of being transmitted from the input signal lead to the RF die through the ring structure.

13. The package of claim 11 further comprising an extra heat spreader attached to the top surface of the ring structure, wherein: the extra heat spreader covers a portion of the top surface of the ring structure at the input side of the package; and each of the one or more input-side leads is attached to a top surface of the extra heat spreader, wherein the RF input signals are capable of being transmitted from the input signal lead to the RF die through the extra heat spreader and the ring structure.

14. The package of claim 13 wherein: the ring structure comprises a plurality of connecting traces at the top surface of the ring structure; the heat spreader comprises a plurality of spreader traces at the top surface of the heat spreader, and a plurality of spreader vias extending vertically through the heat spreader, the extra heat spreader comprises a plurality of extra spreader traces at the top surface of the extra heat spreader, and a plurality of extra spreader vias extending vertically through the extra heat spreader, each of the one or more output-side leads is attached to a corresponding one of the plurality of spreader traces, and each of the plurality of spreader vias electrically connects one of the plurality of spreader traces to a corresponding one of the plurality of connecting traces; and each of the one or more input-side leads is attached to a corresponding one of the plurality of extra spreader traces, and each of the plurality of extra spreader vias electrically connects one of the plurality of extra spreader traces to a corresponding one of the plurality of connecting traces.

15. The package of claim 13 wherein the ring structure comprises a plurality of structure vias on both the input-side and output-side of the package, wherein the plurality of structure vias extends vertically through the ring structure for heat conducting between the carrier and the heat spreader, and between the carrier and the extra heat spreader.

16. The package of claim 11 wherein the one or more input-side leads further comprises at least one of a DC lead configured to receive a DC power source and a ground lead configured to be connected to ground.

17. The package of claim 11 wherein the heat spreader has a ring configuration and is vertically aligned with the ring structure, wherein: the heat spreader covers portions on both the input side and the output side of the package; each of the one or more input-side leads is attached to the top surface of the heat spreader, wherein the RF input signals are capable of being transmitted from the input signal lead to the RF die through the heat spreader and the ring structure; and each of the one or more output-side leads is attached to the top surface of the heat spreader.

18. The package of claim 17 wherein: the ring structure comprises a plurality of connecting traces at the top surface of the ring structure; the heat spreader comprises a plurality of spreader traces at the top surface of the heat spreader, and a plurality of spreader vias extending vertically through the heat spreader, each of the one or more output-side leads and the one or more input-side leads is attached to a corresponding one of the plurality of spreader traces; and each of the plurality of spreader vias electrically connects one of the plurality of spreader traces to a corresponding one of the plurality of connecting traces.

19. The package of claim 17 wherein the ring structure comprises a plurality of structure vias, wherein the plurality of structure vias extends vertically through the ring structure for heat conducting between the carrier and the heat spreader.

20. The package of claim 11 further comprising a lid attached to exposed portions of the top surface of the ring structure, exposed portions of the top surface of the heat spreader, the one or more input-side leads, and the one or more output-side leads so as to seal the RF die.

21. The package of claim 20 wherein: the carrier is formed of a metal, a metal alloy, ceramic, diamond, or metal diamond composites; and the lid is formed of plastic or ceramic.